United States Patent [19]

Oh

[11] Patent Number: 5,825,235
[45] Date of Patent: *Oct. 20, 1998

[54] MULTIPLEXER FOR SEMICONDUCTOR MEMORY DEVICE

[75] Inventor: Jong Hoon Oh, Ichan-shi, Rep. of Korea

[73] Assignee: Hyundai Electronic Industries, Co., Ltd., Ichon-shi, Rep. of Korea

[ * ] Notice: This patent issued on a continued prosecution application filed under 37 CFR 1.53(d), and is subject to the twenty year patent term provisions of 35 U.S.C. 154(a)(2).

[21] Appl. No.: 649,763

[22] Filed: May 15, 1996

[30] Foreign Application Priority Data

May 15, 1995 [KR] Rep. of Korea ....................... 95/11883

[51] Int. Cl.$^6$ ................................................... H03K 17/62
[52] U.S. Cl. ........................................... 327/408; 327/407
[58] Field of Search ....................................... 327/407–413

[56] References Cited

U.S. PATENT DOCUMENTS

| | | | |
|---|---|---|---|
| 3,621,288 | 11/1971 | Brown | 327/408 |
| 4,985,703 | 1/1991 | Kaneyama | 327/408 |
| 5,376,829 | 12/1994 | Rogers et al. | 327/408 |

*Primary Examiner*—Toan Tran
*Attorney, Agent, or Firm*—Thelen Reid & Priest, L.L.P.

[57] ABSTRACT

A multiplexer for a semiconductor memory device which has at least two pads for inputting data signals from the outside. The multiplexer has at least two input lines for inputting the data signals from the at least two pads, respectively, at least two control lines for inputting control signals for switching the data signals from the at least two input lines, respectively, and at least two switching circuits, each of the at least two switching circuits transferring the data signal from a corresponding one of the at least two input lines to an output line in response to the control signal from a corresponding one of the at least two control lines and having a floating node formed to be electrically isolable from the output line and the corresponding input line to prevent a loss of the data signal on the output line. According to the present invention, the multiplexer can prevent a data loss due to a disturbance and accurately transfer the data signals from the at least two pads.

9 Claims, 3 Drawing Sheets

MULTIPLEXER FOR SEMICONDUCTOR MEMORY DEVICE

BACKGROUND OF THE INVENTION

1. Field of the Invention

The present invention relates in general to a multiplexer for selectively transferring data in a semiconductor memory device, and more particularly to a multiplexer for a semiconductor memory device which is capable of preventing a data loss and accurately transferring data.

2. Description of the Prior Art

Generally, a semiconductor memory device such as a dynamic random access memory (referred to hereinafter as DRAM) is designed to have the same number of data input buffers and pads as the maximum possible number of bits. The pads may partially be used according to the number of bits handled by the user, but the data input buffers must be connected to at least two pad s to input bit data therefrom, thereby allowing memory cells coupled to the data input buffers to be available.

For example, a semiconductor memory device designed to input data of the maximum four bites will hereinafter be described with reference to FIGS. 1A to 1C.

FIG. 1A shows a pad connection state of the semiconductor memory device in the case where the input of 4-bit data is required by the user. As shown in this drawing, first to fourth pads 10, 12, 14 and 16 are connected to first to fourth data input buffers 18, 20, 22 and 24, respectively. The first to fourth pads 10, 12, 14 and 16 are also connected to first to fourth data input terminals 26, 28, 30 and 32, respectively.

FIG. 1B shows a pad connection state of the semiconductor memory device in the case where the input of 2-bit data is required by the user. As shown in this drawing, the first pad 10 is connected in common to the first and second data input buffers 18 and 20. The first pad 10 is also connected to the first data input terminal 26. The third pad 14 is connected in common to the third and fourth data input buffers 22 and 24. The third pad 14 is also connected to the second data input terminal 28. However, the second and fourth pads 12 and 16 are not connected to any of the data input buffers 18, 20, 22 and 24.

FIG. 1C shows a pad connection state of the semiconductor memory device in the case where the input of 1-bit data is required by the user. As shown in this drawing, the first pad 10 is connected in common to the first to fourth data input buffers 18, 20, 22 and 24. The first pad 10 is also connected to the first data input terminal 26. However, the second to fourth pads 12, 14 and 16 are not connected to any of the data input buffers 18, 20, 22 and 24. Also, the second to fourth pads 12, 14 and 16 are not connected to the second data input terminal 28.

As shown in FIGS. 1A to 1C, the data input buffers may be connected to different pads according to the requirements of the user. For this reason, the data input buffers comprise a multiplexer for selecting bit data from at least two pads.

Such a conventional multiplexer generally employs MOS transistors. Such MOS transistors have a disadvantage in that they damage data from pads being used, when a voltage is induced in pads being not used, due to a disturbance. In other words, if a MOS transistor connected to a pad being not used is turned on due to a voltage at that pad, it may change data from a pad being used. The above problem with the conventional multiplexer will hereinafter be described in detail with reference to FIG. 2.

FIG. 2 is a circuit diagram of a conventional multiplexer for a semiconductor memory device. As shown in this drawing, the conventional multiplexer comprises first to third NMOS transistors MN1–MN3 connected respectively to first to third pads 40–42, and a comparator CP1 for comparing a voltage at a common node 46 with a reference voltage Vr from a voltage input line 47.

The first NMOS transistor MN1 is adapted to transfer data from the first pad 40 to the common node 46 when a first mode control signal from a first control line 43 has a high logic level Vcc or Vpp. The first mode control signal from the first control line 43 has the high logic level Vcc or Vpp when the first pad 40 is used, but it has a low logic level (i.e., a ground level Vss) when the second or third pad 41 or 42 is used.

The second NMOS transistor MN2 is adapted to transfer data from the second pad 41 to the common node 46 when a second mode control signal from a second control line 44 has the high logic level Vcc or Vpp. The second mode control signal from the second control line 44 has the high logic level Vcc or Vpp when the second pad 41 is used, but it has the low logic level Vss when the first or third pad 40 or 42 is used.

The third NMOS transistor MN3 is adapted to transfer data from the third pad 42 to the common node 46 when a third mode control signal from a third control line 45 has the high logic level Vcc or Vpp. The third mode control signal from the third control line 45 has the high logic level Vcc or Vpp when the third pad 42 is used, but it has the low logic level Vss when the first or second pad 40 or 41 is used.

The comparator CP1 is adapted to compare the voltage at the common node 46 with the reference voltage Vr from the voltage input line 47 to detect the data at the common node 46. If the voltage at the common node 46 is higher than the reference voltage Vr from the voltage input line 47, the comparator CP1 determines the data at the common node 46 as "1". To the contrary, in the case where the voltage at the common node 46 is lower than the reference voltage Vr from the voltage input line 47, the comparator CP1 determines the data at the common node 46 as "0".

However, in the case where a negative voltage is induced in the second or third pad 41 or 42 under the condition that the first mode control signal has the high logic level Vcc or Vpp and the second and third mode control signals have the low logic level Vss, the comparator CP1 determines the data at the common node 46 as "0" although the first NMOS transistor MN1 transfers data of "1" to the common node 46. This reason is that the second or third NMOS is transistor MN2 or MN3 is turned on because of the negative voltage in the second or third pad 41 or 42 to reduce the voltage at the common node 46 nearly to the ground level Vss.

SUMMARY OF THE INVENTION

Therefore, the present invention has been made in view of the above problem, and it is an object of the present invention to provide a multiplexer for a semiconductor memory device which is capable of preventing a data loss due to a disturbance and accurately transferring data.

In accordance with the present invention, the above and other objects can be accomplished by a provision of a multiplexer for a semiconductor memory device, the semiconductor memory device having at least two pads for inputting data signals from the outside, comprising at least two input lines for inputting the data signals from the at least two pads, respectively; at least two control lines for inputting control signals for switching the data signals from the at least two input lines, respectively, and at least two switching means, each of the at least two switching means transferring the data signal from a corresponding one of the at least two input lines to an output line in response to the control signal from a corresponding one of the at least two control lines and having a floating node formed to be electrically isolable from the output line and the corresponding input line to prevent a loss of the data signal on the output line.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

Figure 1A:
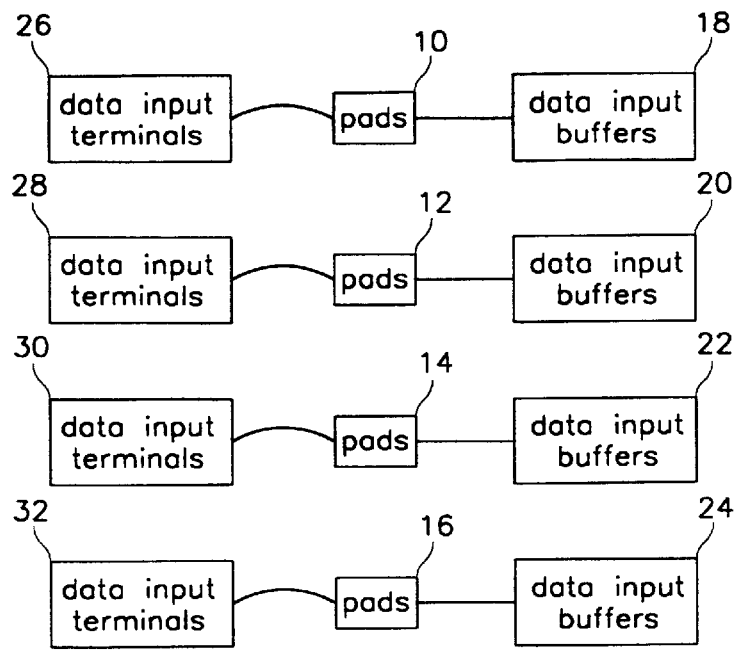
FIGS. 1A to 1C are block diagrams illustrating various arrangements of a conventional data input circuit for a semiconductor memory device.
Figure 1B:
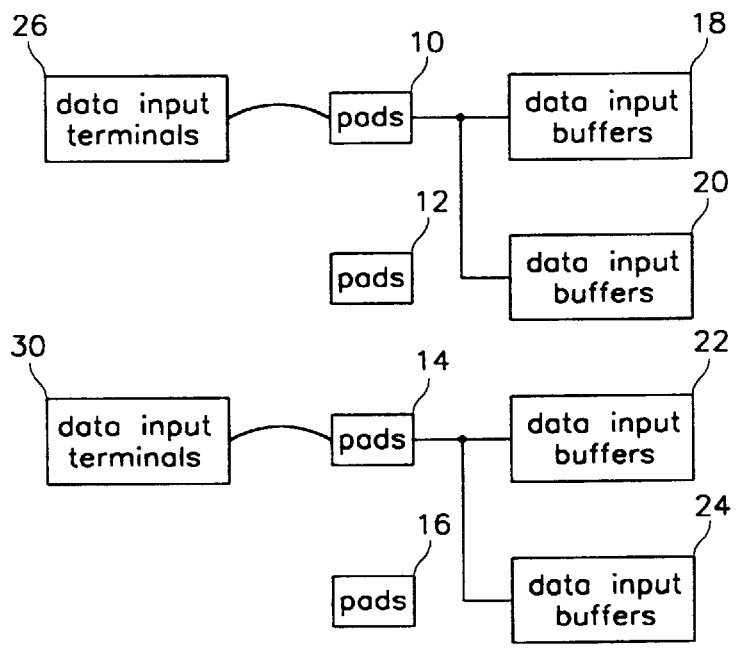
Figure 1C:
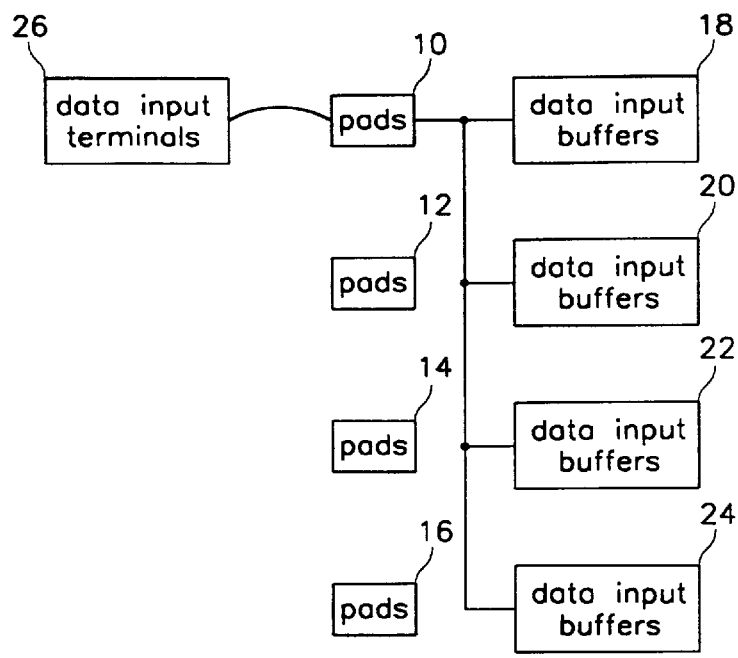
Figure 2:
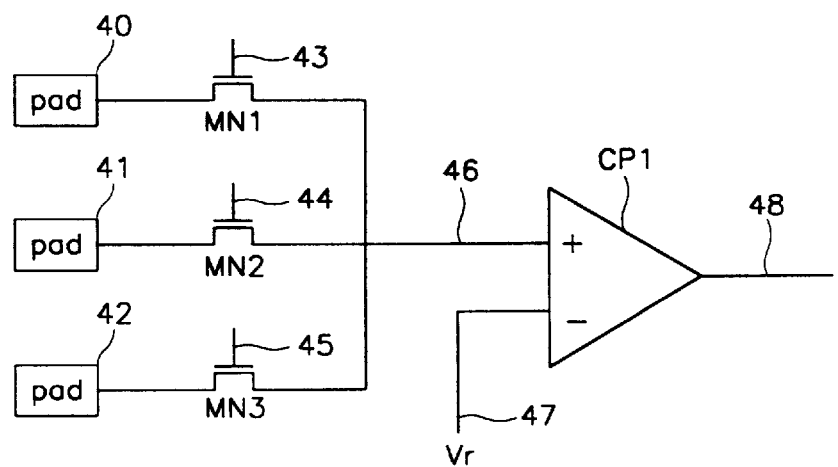
FIG. 2 is a circuit diagram of a conventional multiplexer for a semiconductor memory device.
Figure 3:
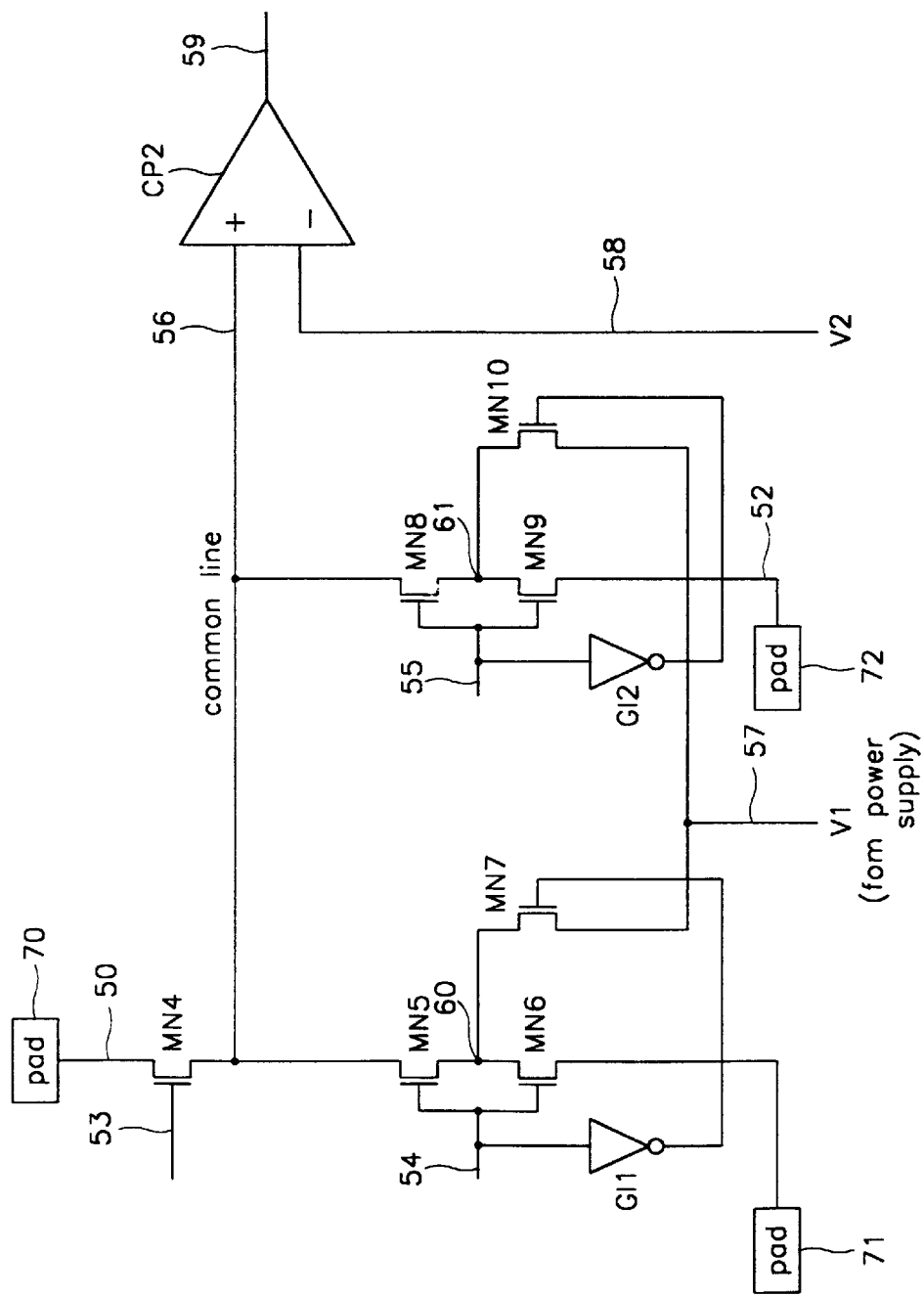
FIG. 3 is a circuit diagram of a multiplexer for a semiconductor memory device in accordance with an embodiment of the present invention.

Referring to FIG. 3, there is shown a circuit diagram of a multiplexer for a semiconductor memory device in accordance with an embodiment of the present invention. As shown in this drawing, the multiplexer for the semiconductor memory device comprises a first NMOS transistor MN4 connected between a first input line 50 and a common line 56. The first NMOS transistor MN4 has its gate terminal for inputting a first control signal from a first control line 53. The first NMOS transistor MN4 is adapted to selectively transfer a data signal on the first input line 50 to the common line 56 according to a logic state of the first control signal from the first control line 53. In other words, if the first control signal from the first control line 53 is high in logic, the first NMOS transistor MN4 is turned on to transfer the data signal on the first input line 50 to the common line 56 through its drain and source terminals. To the contrary, in the case where the first control signal from the first control line 53 is low in logic, the first NMOS transistor MN4 is turned off. As a result, the data signal on the first input line 50 is not transferred to the common line 56, The multiplexer for the semiconductor memory device further comprises a second NMOS transistor MN5 connected between a first floating node 60 and the common line 56, and a third NMOS transistor MN6 connected between a second input line 51 and the first floating node 60. The second and third NMOS transistors MN5 and MN6 have their gate terminals for commonly inputting a second control signal from a second control line 54. The second and third NMOS transistors MN5 and MN6 are adapted to transfer a data signal on the second input line 51 to the Common line 56 when the second control signal from the second control line 54 is high in logic. In other words, when the second control signal from the second control line 54 is high in logic, the third N MOS transistor MN6 is turned on to transfer the data signal on the second input line 51 to the first floating node 60. Also, the second NMOS transistor MN5 is turned on to transfer the data signal at the first floating node 60 transferred by the third NMOS transistor MN6 to the common line 56. To the contrary, in the case where the second control signal from the second control line 54 is low in logic, the second and third NMOS transistors MN5 and MN6 are turned off to electrically isolate the first floating node 60 from the common line 56 and the second input line 51.

The multiplexer for the semiconductor memory device further comprises a first inverter GI1 for inverting the second control signal from the second control line 54, and a fourth NMOS transistor MN7 for transferring a first voltage V1 from a first voltage line 57 to the first floating node 60 in response to an output signal from the first inverter GI1. The fourth NMOS transistor MN7 has its gate terminal for inputting the inverted second control signal from the first inverter GI1. When the inverted second control signal from the first inverter GI1 is high in logic, the fourth NMOS transistor MN7 is turned on to transfer the first voltage V1 from the first voltage line 57 to the first floating node 60. The first voltage line 57 is connected to a power supply circuit (not shown) to input the first voltage V1 therefrom. The voltage V1 from the voltage source has a level higher than a low logic level of the control signal on control line 54.

Under the condition that the first floating node 60 is electrically isolated from the common line as and the second input line 51, the first voltage V1 from the first voltage line 57 is maintained at the first floating node 60 when the second control signal from the second control line 54 is low in logic (i.e., it has the ground level Vss) and a voltage on the second input line 51 has a level higher than the ground level Vss. To the contrary, in the case where the voltage on the second input line 51 has a level lower than the ground level Vss by a threshold voltage of the third NMOS transistor MN6 or more, a voltage higher than the ground level Vss is maintained at the first floating node 60. At this time, the voltage a the first floating node 60 is determined by multiplying a difference between the first voltage V1 from the first voltage line 57 and the voltage on the second input line 51 by a ratio of resistances of the third and fourth NMOS transistors MN6 and MN7 when they are turned on. Namely, the voltage at the first floating node 60 can be determined as follows:

$$V_{60}=(V1-V_{51})*R_6/(R_6+R_7) \qquad (1)$$

where, $V_{60}$ is the voltage at the first floating node 60, $V_{51}$ is the voltage on the second input line 51, and $R_6$ and $R_7$ are the resistances of the third and fourth NMOS transistors MN6 and MN7 when they are turned on, respectively.

The third NMOS transistor MN6 is designed to have a resistance much higher than that of the fourth NMOS transistor MN7. The third NMOS transistor MN6 is also designed to have a channel width much narrower than that of the fourth NMOS transistor MN7. For this reason, when the second control signal from the second control line 54 is low in logic, a voltage higher than that of the second control signal is maintained at the first floating node 60 although the third NMOS transistor MN6 is turned on because the voltage on the second input line 51 is lower than that of the second control signal by the threshold voltage of the third NMOS transistor MN6 or more. As a result, the data signal on the common line 56 is not influenced by any voltage variation on the second input line 51.

In result, the second to fourth NMOS transistors MN5–MN7 and the first inverter GI1 constitute a switching circuit for transferring the data signal on the second input line 51 to the common line 56 according to the logic state of the second control signal from the second control line 54 and for allowing the data signal on the common line 56 not to be influenced by any voltage variation on the second input line 51.

The multiplexer for the semiconductor memory device further comprises a fifth NMOS transistor MN8 connected between a second floating node 61 and the common line 56, and a sixth NMOS transistor MN9 connected between a third input line 52 and the second floating node 61. The fifth and sixth NMOS transistors MN8 and MN9 have their gate terminals for commonly inputting a third control signal from a third control line 55. The fifth and sixth NMOS transistors MN8 and MN9 are adapted to transfer a data signal on the third input line 52 to the common line 56 when the third control signal from the third control line 55 is high in logic. In other words, when the third control signal from the third control line 55 is high in logic, the sixth NMOS transistor MN9 is turned on to transfer the data signal on the third input line 52 to the second floating node 61. Also, the fifth NMOS transistor MN8 is turned on to transfer the data signal at the second floating node 61 transferred by the sixth NMOS transistor MN9 to the common line 56. To the contrary, in the came where the third control signal from the third control line 55 is low in logic, the fifth and sixth NMOS transistors MN8 and MN9 are turned off to electrically isolate the second floating node 61 from the common line 56 and the third input line 52.

The multiplexer for the semiconductor memory device further comprises a second inverter GI2 for inverting the third control signal from the third control line 55, and a seventh NMOS transistor MN10 for transferring the first voltage V1 from the first voltage line 57 to the second floating node 61 in response to an output signal from the second inverter GI2. The voltage V1 from the voltage source has a level higher than a low logic level of the control signal on control line 55. The seventh NMOS transistor MN10 has its gate terminal for inputting the inverted third control signal from the second inverter GI2. When the inverted third control signal from the second inverter GI2 is high in logic, the seventh NMOS transistor MN10 is turned on to transfer the first voltage V1 from the first voltage line 57 to the second floating node 61.

Under the condition that the second floating node 61 is electrically isolated from the common line 56 and the third input line 52, the first voltage V1 from the first voltage line 57 is maintained at the second floating node 61 when the third control signal from the third control line 55 is low in logic (i.e., it has the ground level Vss) and a voltage on the third input line 52 has a level higher than the ground level Vss. To the contrary, in the case where the voltage on the third input line 52 has a level lower than the ground level Vss by a threshold voltage of the sixth NMOS transistor MN9 or more, a voltage higher than the ground level Vss is maintained at the second floating node 61. At this time, the voltage at the second floating node 61 is determined by multiplying a difference between the first voltage V1 from the first voltage line 57 and the voltage on the third input line 52 by a ratio of resistances of the sixth and seventh NMOS transistors MN9 and MN10 when they are turned on, Namely, the voltage at the second floating node 61 can be determined as follows:

$$V_{61}=(V1-V_{52})*R_8/(R_9+R_{10}) \qquad (2)$$

where, $V_{61}$ is the voltage at the second floating node 61, $V_{52}$ is the voltage on the third input line 52, and $R_9$ and $R_{10}$ are the resistances of the sixth and seventh NMOS transistors MN9 and MN10 when they are turned on, respectively.

The sixth NMOS transistor MN9 is designed to have a resistance much higher than that of the seventh NMOS transistor MN10. The sixth NMOS transistor MN9 is also designed to have a channel width much narrower than that of the seventh NMOS transistor M10. For this reason, when the third control signal from the third control line 55 is low in logic, a voltage higher than that of the third control signal is maintained at the second floating node 61 although the sixth NM0S transistor MN9 is turned on because the voltage on the third input line 52 is lower than that of the third control signal by the threshold voltage of the sixth NMOS transistor MN9 or more. As a result, the data signal on the common line 56 is not influenced by any voltage variation on the third input line 52.

In result, the fifth to seventh NMOS transistors MN8–MN10 and the second inverter GI2 constitute a switching circuit for transferring the data signal on the third input line 52 to the common line 56 according to the logic state of the third control signal from the third control line 55 and for allowing the data signal on the common line 56 not to be influenced by any voltage variation on the third input line 52.

The first to third input lines 50–52 are connected respectively to the associated pads 70,71 and 72 to input data signals therefrom. The first to third control lines 53–55 are connected to a control circuit (not shown) to input the first to third control signals, respectively. The first to third control signals are set by the manufacturer in such a manner that only one thereof is high in logic. Further, the data signal on the first input line 50 may also be controlled by the switching circuit provided with the second to fourth SMOS transistors MN5–MN7 and the first inverter GI1, instead of the first NMOS transistor MN4.

The multiplexer for the semiconductor memory device further comprises a comparator CP2 for comparing the data signal on the common line 56 with a second voltage V2 from a second voltage line 58 which is a reference voltage. Similarly to the first voltage line 57, the second voltage line 58 is also connected to the power supply circuit to input the second voltage V2 therefrom. The comparator CP2 is adapted to compare the voltage on the common line 56 with the second voltage V2 from the second voltage line 58 to generate a buffered data signal on an output line 59 which is high or low in logic. In other words, if the voltage on the common line 56 is higher than the second voltage V2 from the second voltage line 58, the comparator CP2 supplies a buffered data signal of high logic to the output line 59. To the contrary, in the case where the voltage on the common line 56 is lower than the second voltage V2 from the second voltage line 59, the comparator CP2 supplies a buffered data signal of low logic to the output line 59. The data signal on the output line 59 is transferred to a memory cell array black, not shown. In result, the comparator CP2 functions to buffer the data signal on the common line 56.

As apparent from the above description, according to the present invention, the multiplexer for the semiconductor memory device comprises the floating nodes formed to be electrically isolable from the input lines and the common line. The data signal on the common line can be prevented from being damaged due to voltages on the input lines, by applying a desired voltage to the floating nodes. Therefore, the multiplexer for the semiconductor memory device can stably and accurately transfer data signals from at least two input lines to the output line.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A multiplexer for a semiconductor memory device, said semiconductor memory device having at least two pads for inputting data signals from the outside, the multiplexer comprising:
   a) at least two input lines for inputting the data signals from said at least two pads, respectively;
   b) at least two control lines for inputting control signals for switching the data signals from said at least two input lines, respectively; and
   c) a least two switching means, each of said at least two switching means transferring the data signal from a corresponding one of said at least two input lines to an output line in response to the control signal from a corresponding one of said at least two control lines, each of said at least two switching means including:
      1) a floating node formed to be electrically isolatable from said output line and from said corresponding input line to prevent a loss of the data signal on said output line by selectively receiving a voltage from a voltage source that is at a level higher than a low logic level of the control signal from said corresponding control line;
      2) a first NMOS transistor for selectively connecting the floating node to the output line in response to the control signal from the corresponding control line;
      3) a second NMOS transistor for selectively connecting the floating node to the corresponding input line in response to the control signal from the corresponding control line; and
      4) a third NMOS transistor for selectively transferring the voltage from the voltage source to the floating node in response to the control signal from the corresponding control line; and
      5) an inverter having an input connected to the corresponding control line and an output connected to a gate of the third NMOS transistor so as to control application of the voltage from the voltage source to the floating node.

2. The multiplexer of claim 1, wherein:
   said first and second NMOS transistors are driven in complementary cooperation with said third NMOS transistor.

3. A multiplexer for a semiconductor memory device, said semiconductor memory device having at least two pads for inputting data signals from the outside, the multiplexer comprising:
   a) at least two input lines for inputting the data signals from said at least two pads, respectively;
   b) at least two control lines for inputting control signals for switching the data signals from said at least two input lines, respectively;
   c) a least two switching means, each of said at least two switching means transferring the data signal from a corresponding one of said at least two input lines to an output line in response to the control signal from a corresponding one of said at least two control lines, each of said at least two switching means including:
      1) a floating node formed to be electrically isolatable from said output line and from said corresponding input line to prevent a loss of the data signal on said output line;
      2) a first NMOS transistor for selectively connecting the floating node to the output line in response to the control signal from the corresponding control line;
      3) a second NMOS transistor for selectively connecting the floating node to the corresponding input line in response to the control signal from the corresponding control line; and
      4) a third NMOS transistor for selectively transferring the voltage from the voltage source to the floating node in response to the control signal from the corresponding control line; and
      5) an inverter having an input connected to the corresponding control line and an output connected to a gate of the third NMOS transistor so as to control application of the voltage from the voltage source to the floating node; and
   d) buffering means for buffering the data signal on said output line.

4. The multiplexer of claim 3, wherein said buffering means includes:
   a reference voltage source for generating a reference voltage signal; and
   a comparator for comparing the data signal on said output line with the reference voltage signal from said reference voltage source.

5. A multiplexer for a semiconductor memory device that has at least a first pad, a second pad, and a third pad for inputting respective data signals, the multiplexer comprising:
   at least a first NMOS transistor connected to the first pad for transferring data from the first pad to a common node;
   at least a second NMOS transistor connected to the second pad for transferring data from the second pad to the common node;
   at least a third NMOS transistor connected to the third pad for transferring data from the third pad to the common node; and
   a comparator for comparing a voltage at the common node with a reference voltage, to determine data at the common node to have a high logic value when the voltage at the common node is higher than the reference voltage and to determine data at the common node to have a low logic value when the voltage at the common node is lower than the reference voltage;
   wherein the logic value of data at the common node is not affected by application of a negative voltage to one or more pads.

6. The multiplexer of claim 5, wherein:
   the first pad receives data, but the second and third pads do not receive data.

7. The multiplexer of claim 5, wherein:
   the first and second pads receive data, but the third pad does not receive data.

8. The multiplexer of claim 5, wherein:
   the first, second, and third pads all receive data.

9. The multiplexer of claim 5, wherein the comparator constitutes:
   a buffer for buffering the data signal on the common node.

* * * * *